United States Patent
Brhel et al.

(10) Patent No.: US 7,270,720 B2
(45) Date of Patent: Sep. 18, 2007

(54) SUPERELASTIC ELEMENT MADE OF A COPPER ALLOY AND METHOD FOR IMPARTING A CURVATURE OF A GIVEN GEOMETRY

(75) Inventors: Klaus-Peter Brhel, Weingarten (DE); Harald Fischer, Weingarten (DE)

(73) Assignee: Forschungszentrum Karlsruhe GmbH, Karlsruhe (DE)

(*) Notice: Subject to any disclaimer, the term of this patent is extended or adjusted under 35 U.S.C. 154(b) by 585 days.

(21) Appl. No.: 10/837,282

(22) Filed: Apr. 30, 2004

(65) Prior Publication Data

US 2004/0200551 A1 Oct. 14, 2004

Related U.S. Application Data

(63) Continuation-in-part of application No. PCT/EP02/12230, filed on Nov. 2, 2002.

(30) Foreign Application Priority Data

Dec. 19, 2001 (DE) ................................ 101 62 296

(51) Int. Cl.
*C22F 1/08* (2006.01)

(52) U.S. Cl. ..................................... 148/562; 148/564

(58) Field of Classification Search ................ 148/562, 148/564
See application file for complete search history.

(56) References Cited

U.S. PATENT DOCUMENTS 4,518,444 A * 5/1985 Albrecht et al. ............ 148/402
6,168,272 B1 * 1/2001 Larrue ......................... 351/41

FOREIGN PATENT DOCUMENTS

| JP | 59 179771 | 10/1984 |
|----|-----------|---------|
| JP | 20 01020026 | 1/2001 |
| WO | WO96/24086 | 8/1996 |
| WO | WO98/53359 | 11/1998 |

* cited by examiner

*Primary Examiner*—George Wyszomierski
(74) *Attorney, Agent, or Firm*—Klaus J. Bach

(57) ABSTRACT

In a method of bending a rod- or rod-like unfinished workpiece of a single crystal material of a Cu alloy the workpiece is bent at an elevated temperature so as to provide for a predetermined curvature and then the workpiece is further heated whereby the curvature is established but the superelasticity is lost, the workpiece is cooled down and then tempered at another raised temperature for at least one hour and is then immediately quenched in a cooling medium.

6 Claims, 1 Drawing Sheet

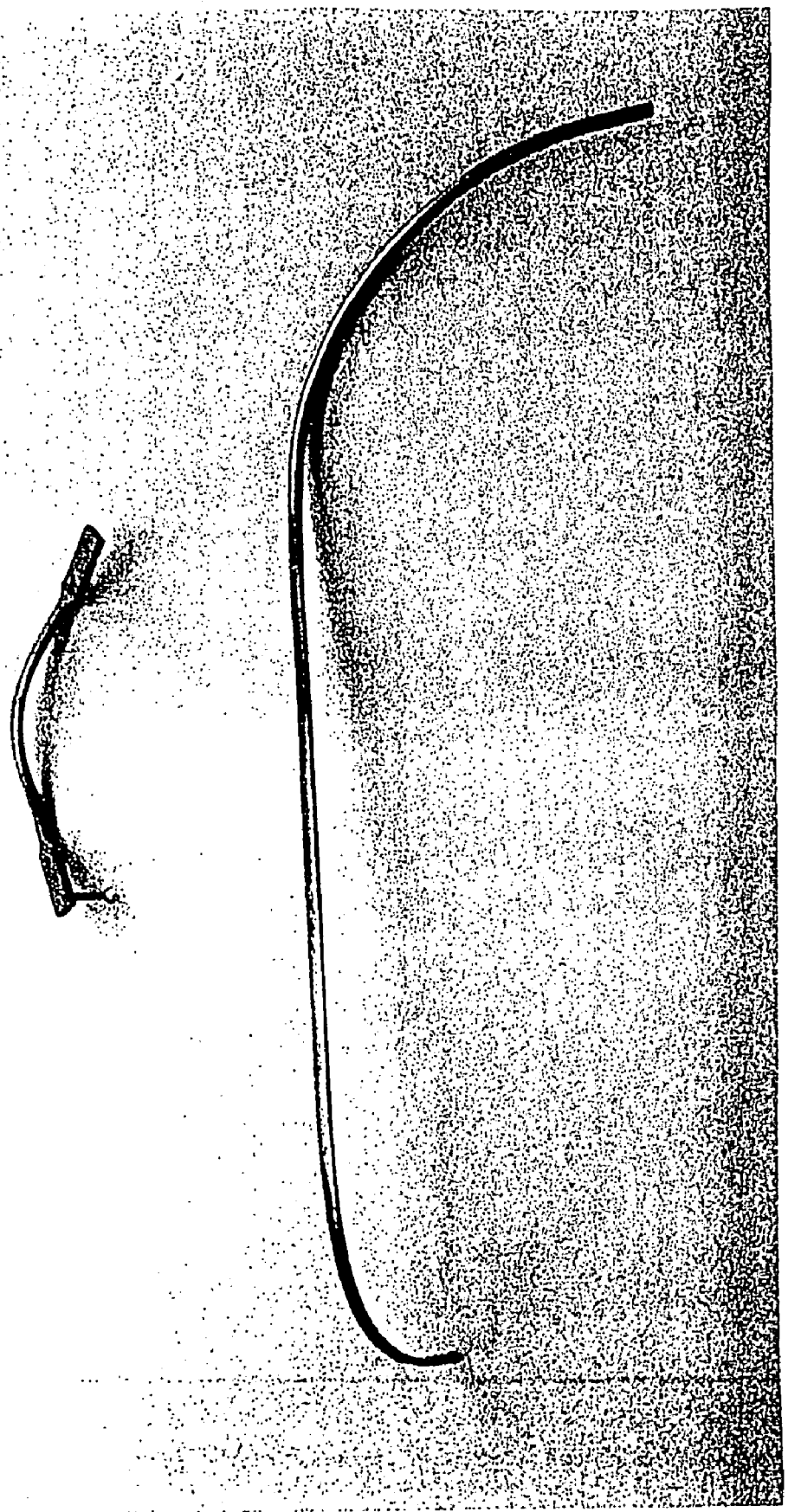

SUPERELASTIC ELEMENT MADE OF A COPPER ALLOY AND METHOD FOR IMPARTING A CURVATURE OF A GIVEN GEOMETRY

This is a Continuation-In-Part Application of International Application PCT/EP02/12230 filed Nov. 2, 2002 and claiming the priority of German Application 101 62 296.1 filed Dec. 19, 2001.

BACKGROUND OF THE INVENTION

The invention relates to superelastic components of a copper alloy and a method of imparting to the component a particular desired shape.

Superelastic, single-crystal Cu alloys have a high elasticity. They exceed in elasticity the well-known super elastic NiTi alloys. NiTi alloys have a super-elasticity of up to 8%. The superelastic elasticity of NiTi alloys is demonstrated by eyeglass frames partially manufactured therefrom (in this connection, see for example DE 689 293 Te or EP 0 316 628 B1).

A straight unfinished product such as for example a rod consisting of a superelastic Cu alloy will reach an elasticity of 20%. These excellent superelastic properties are known but it can be shown so far only for linear wires or rods. It has not been possible so far to impart to such a straight unfinished product a particular curvature while maintaining the super-elasticity.

It is therefore the object of the present invention to provide building components of a single crystal superelastic Cu alloy with a predetermined curvature, that is, to form them from a straight unfinished product and to provide a method by which such curved components can be formed while their superelasticity is maintained.

SUMMARY OF THE INVENTION

In a superelastic element obtained by bending a rod or rod-like unfinished workpiece of a single crystal material of a Cu alloy at an elevated temperature so as to provide for a predetermined curvature and then heating the workpiece whereby the curvature is established but the superelasticity is lost, the previously coated workpiece is tempered at another raised temperature so for at least one hour and is then immediately quenched in a cooling medium.

The curvature may be disposed in a single plane or it may be spatial area or a combination of such single-plane and spatial curvature areas.

Preferably, such a component is surface treated for expedient or aesthetic reasons. To this end, the component is coated by a metallic layer which may be for example gold or another noble metal. It may however also be a dielectric material such as a polymer or a ceramic material, but it must be thin enough such that the superelasticity of the component is not detrimentally affected and that it will not crack even in the areas with the largest curvature.

If such components are used in the medical or clinical area, the exposed surface of the component must in any case be inert or at least tissue compatible with respect to the adjacent part in contact therewith. Combination layers may also be used as long as they do not crack and do not detrimentally affect the superelasticity.

For providing these components, the unfinished material is heated to a bending temperature of 200 to 900° C.

The tool of a material that can be subjected to temperatures suitable for the process has an exposed front with the geometry of the desired curvature. It is heated at most to the bending temperature at which the desired curvature is imparted to the unfinished workpiece successively over the length of the exposed front so as to avoid fracture.

After the predetermined curvature geometry is imparted to this workpiece, the structure is cooled and is removed from the bending device.

During the shaping under the influence of temperature, the single crystal structure is disturbed in the bending area so that, after subsequent cooling, there is no superelasticity in the bending area. To reinstate the superelasticity lost during heating and bending, the workpiece, after having been cooled down to ambient temperature, is tempered in an oven preheated to 750 to 900°. The superelasticity is then re-instated and is frozen in the following step, wherein the workpiece is removed from the oven after a certain tempering period and is rapidly quenched in a cooling medium which has only cooling functions.

It has been found that, upon tempering for at least ½ hour, the superelasticity can be re-instated. But with tempering for up to one hour the elasticity can be conserved only in a very limited way that is, depending on the use, for only up to about 3 months. Longer tempering periods of more than one hour or even longer preserve the superelasticity substantially longer. The relationship however is not linear.

During imparting the desired curvature geometry, the bending temperature is for example 850° C.

The liquid for the quenching bath only has the purpose of thermal quenching and re-establishing the superelasticity. It does not react chemically with the workpiece material—and is not supposed to—since the surface should not be affected by this procedure. Water is for example a suitable quenching medium.

An example for the use of such workpieces is an eyeglass frame which may consist at least partially of such a material (ear pieces, nose pieces).

A construction component provided in this way with an extraordinary elasticity has many applications since the imparted shape which is spatial and therefore space-consuming can be reduced by the elastic properties to a flat narrow area. However, upon removal of the constraining forces, the component will again instantly assume the spatial configuration imparted to the workpiece. The following incomplete listing of devices or products is given as an example of products: Eyeglass frames, tension and compression springs, prevention spiral, arterial stoppers, force limiter, clamp handles.

Below the invention will be described in greater detail on the example of a superelastic eyeglass frame with reference to the accompanying drawings.

BRIEF DESCRIPTION OF THE DRAWINGS

The FIGURE shows a yoke and a nose web of eyeglasses consisting of the superelastic material.

DETAILED DESCRIPTION OF THE INVENTION

The yokes of glasses must be elastic over their full length particularly in their highly curved areas adjacent the lenses. With its end at the high curvature, the frame yoke is directly connected to the lenses or, respectively the frame thereof. The wider curvature area is disposed directly over the ear of the wearer.

A high elasticity however is also needed for the nose bridge, which connects the two lenses. For example, this nose bridge is screwed by way of two bores formed in the opposite ends to the lenses or the frames thereof, so that both lenses are firmly interconnected in a folded state as well as in the pivoted open state.

In the folded state, both yokes must be superelastic over the full length thereof since they are folded haphazardly by the wearer until the glasses are ready for placement into a casing. The main non-foldable and smaller areas of eyeglasses, which cannot change their shape, are the lenses.

Since the method is still in the testing phase, the method is presently still performed manually. For the manufacture of the eyeglass yoke and the nose bridge, a welding wire-like workpiece with circular cross-section is used. The unfinished product is a rod of 1.5 mm thickness and 350 mm length. It was obtained from the comparing Memory Metalle GmbH, 79567 Weil am Rhein, Germany. In accordance with the delivery documents, it consists of a Cu Al Ni Fe single crystal of the given geometry. A quantification of the compounds was not provided. No data sheet was available.

The shape-imparting procedure is performed in the embodiment presented herein as follows:

The unfinished single crystal product in the form of a thin rod of 1.5 mm diameter is engaged at one end by a clamping device which is pivotally supported on a base plate. At a distance, another clamping device is rigidly supported on the base plate by which the rod is also firmly engaged. The area to be curved is disposed between the two clamping devices.

The bending tool is mounted on a support structure which is also connected to the support plate. The bending tool consists of a solid square rod of stainless steel or copper, which remains form stable under all process conditions. It may also consist of a different material if it is thermally suitable for the process. The bending tool has an exposed openly accessible front part provided with the curvature desired for the product. The area of the unfinished product which is clamped and the bending tool are each connected to an electric circuit so that both parts can be heated independently by electric resistance heating.

The temperature of the initial part and of the tool is detected at a suitable location each by a thermocouple.

In the example, the desired curvature is simple and planar. The clamped-in rod part and bending tool are disposed in a plane, that is, the pivot plane.

During heating, both parts, the clamped-in rod or wire piece and the bending tool, are disposed closely adjacent one another without contacting each other. Both electric circuits by which current flow through the rod section and the bending tool is established are closed so that the rod piece and the tool are heated. The bending tool must be at least 650° C. in order to prevent the rapid cooling of the rod or wire piece in contact therewith. However, its temperature is not higher than 856° C., which is the bending temperature for the rod or wire. When the bending tool is at the predetermined temperature and the clamped-in piece of rod or wire is at bending temperature in the bending area, the wire is put into the bending tool jig, and when it is fully in place, the two electric circuits are interrupted. Both parts are then cooled down. The curvature shape is imparted to the rod or wire. When the red glow disappears, the wire or rod is removed from the clamping device and permitted to cool down naturally.

The following method step restores the superelasticity:

The rod or wire is placed into an oven which has been preheated to 850° C. and is tempered for 12 hours.

After the tempering, the rod or wire is removed and is immediately quenched in water of ambient temperature. Now the rod or wire has the predetermined curvature together with the superelastic properties over its full length and this curvature is preserved as desired. The building component can fulfill the predetermined function.

The radius of curvature can only be so small that the cross-section of the almost finished product during bending into the predetermined does not change essentially, that is, the material must not be subjected to material flow processes in the bent area; they would irreparably destroy the material/crystal structure. With band-like, unfinished workpieces, the thickness of the band must therefore be taken into consideration.

In this way, prototype sunglasses were prepared, wherein both superelastic yokes and the superelastic nose bridge are screwed with their respective ends directly onto the glasses. The glasses have been used for four months constantly in a testing program and still have the extraordinary folding capability.

The described use of the components of superelastic single-crystal Cu-alloys is exemplary and serves only to show the establishment of a curvature in the superelastic material and the re-establishment of the superelasticity in the material of the components. The method is however not limited to the manufacture of glasses.

What is claimed is:

1. A method of imparting a planar or a spatial curvature of a predetermined form to a rod or band-like unfinished workpiece of a superelastic single-crystal Cu-alloy, and conserving the curvature, said method comprising the steps of heating the unfinished workpiece to be bent to a bending temperature of 700 to 900° C., heating at the same time a bending tool of a thermally sufficiently resistant material which is provided with the desired curvature to a temperature not exceeding the bending temperature at which the predetermined curvature can be successively imparted to the workpiece to be bent without fracture, when the predetermined curvature has been fully imparted to the workpiece, permitting the workpiece to cool down, removing the workpiece from the bending tool, and, for re-establishing the superelasticity which has been lost during heating and bending, placing the workpiece, after it has been cooled to ambient temperature, into an oven which has been preheated to 750 to 900° C. for at least one hour for tempering the workpiece, and then removing the workpiece from the oven and immediately quenching the workpiece in a cooling medium.

2. The method according to claim 1, wherein the surface of said rod or band-like unfinished workpiece is provided with a coating of one of a metal, a di-electric material, and a ceramic material, which does not detrimentally affect the superelasticity of the workpiece.

3. The method according to claim 2, wherein the surface of the coating on said workpiece, which is exposed to the ambient, is inert or tissue compatible.

4. The method according to claim 1, wherein said workpiece is bent at a temperature of 850° C.

5. The method according to claim 1, wherein for tempering the workpiece, said oven is heated to 850° C.

6. The method according to claim 1, wherein said cooling medium is water.

* * * * *